United States Patent
Prasanna

[19]

[11] Patent Number: 6,078,630
[45] Date of Patent: Jun. 20, 2000

[54] PHASE-BASED RECEIVER WITH MULTIPLE SAMPLING FREQUENCIES

[75] Inventor: G. N. Srinivasa Prasanna, Clinton, N.J.

[73] Assignee: Lucent Technologies Inc., Murray Hill, N.J.

[21] Appl. No.: 09/066,500

[22] Filed: Apr. 23, 1998

[51] Int. Cl.[7] .................................................. H03D 3/18
[52] U.S. Cl. ........................ 375/328; 375/316; 375/371; 375/332
[58] Field of Search ..................................... 375/340, 316, 375/373, 376, 215, 371, 327, 328, 329, 332; 329/304, 306, 325; 327/147, 152, 158; 370/516; 455/260

[56] References Cited

U.S. PATENT DOCUMENTS

| | | | |
|---|---|---|---|
| 4,416,017 | 11/1983 | Jasper et al. | 375/99 |
| 5,222,144 | 6/1993 | Whikehart | 381/15 |
| 5,574,756 | 11/1996 | Jeong | 375/376 |
| 5,640,698 | 6/1997 | Shen et al. | 455/323 |
| 5,727,027 | 3/1998 | Tsuda | 375/329 |
| 5,920,220 | 7/1999 | Takao et al. | 327/233 |
| 5,937,013 | 8/1999 | Lam et al. | 375/340 |
| 5,943,363 | 8/1999 | Hanson et al. | 375/206 |

*Primary Examiner*—Chi H. Pham
*Assistant Examiner*—Emmanuel Bayard
*Attorney, Agent, or Firm*—Steve Mendelsohn

[57] ABSTRACT

A receiver for input signals generated using a phase-based modulation scheme such as bipolar-phase shift-keying (BPSK) modulation or quadrature-phase shift-keying (QPSK) modulation. The receiver can sample the input signal using one of at least two different sampling frequencies that are selected such that at least one of the sampling frequencies is not harmonically related to the carrier frequency of the input signal by a ratio of small numbers. In this way, the receiver can avoid interference patterns that can result when the sampling frequency and the carrier frequency are harmonically related. In one embodiment, the receivers are hard-limiting receivers that are suitable for use in the remote nodes of fiber-to-the-curb (FTTC) communication systems, where low-power receivers are desirable.

17 Claims, 1 Drawing Sheet

PHASE-BASED RECEIVER WITH MULTIPLE SAMPLING FREQUENCIES

BACKGROUND OF THE INVENTION

1. Field of the Invention

The present invention relates to communications based on phase-based modulation, such as bipolar-phase shift-keying (BPSK) modulation or quadrature-phase shift-keying (QPSK) modulation.

2. Description of the Related Art

In a typical fiber-to-the-curb (FTTC) telecommunication system, signals are transmitted between a central office (CO) and one or more remote nodes as optical signals over optical fibers, while signals are transmitted between each remote node and one or more consumer product equipment (CPE) units (e.g., telephones, faxes, computers) as electrical signals over copper wires. As such, each remote node has components for receiving downstream optical signals from the central office, converting the optical signals into electrical signals, and transmitting the electrical signals to the CPE units. Similarly, each remote node has components for receiving upstream electrical signals from the CPE units, converting the electrical signals into optical signals, and transmitting the optical signals to the central office.

In certain implementations of an FTTC telecommunication system, at least some of the signals received by the remote nodes are signals that have been modulated using bipolar-phase shift-keying (BPSK) or quadrature-phase shift-keying (QPSK) modulation. For example, the upstream electrical signals received by the remote nodes may be BPSK/QPSK signals. In such an implementation, each remote node has one or more BPSK/QPSK receivers for receiving the BPSK/QPSK signals for subsequent conversion from electrical to optical and further transmission.

In BPSK/QPSK modulation, information is encoded in the phase of the signals. In order to convert BPSK/QPSK signals, a receiver samples the signal stream at a sufficiently high rate to detect the locations of the zero crossings in the signal from which the phase of the signal can be derived. In order to keep costs down and in order to provide a low-power remote node for FTTC applications that withstands a wide range of operating conditions, it is desirable to implement a BPSK/QPSK receiver using hard-limiting techniques that resolve only the most significant bit (i.e., the sign bit) in the sampled signal level, thereby determining whether the sample is positive or negative. The phase of the BPSK/QPSK signal can then be derived from the locations of transitions between positive and negative samples (i.e., the zero crossings).

In general, BPSK/QPSK phase modulation schemes offer robust performance and simple reception using hard-limiting, albeit at moderate bit-rates. They are frequently used for low-bit rate upstream transmission in FTTC and similar systems, where the receiver (at the remote node) is highly power-constrained. Hard-limiting reception eliminates A/D conversion, reduces internal bitwidths, and can be implemented in a frequency-programmable manner, with low power and cost. A large class of hard-limiting receivers operates on samples of the hard-limited signal. Such sampled hard-limiting receivers are limited in phase-resolution, depending on the harmonic relationship between the carrier frequency and the sampling frequency. Limited phase-resolution can cause considerable loss in margin.

FIG. 1 shows the phase resolution of a BPSK/QPSK receiver as the carrier frequency of the BPSK/QPSK signal changes relative to the sampling frequency (i.e., the rate at which the BPSK/QPSK signal is sampled). The normalized frequency plotted in FIG. 1 is defined as the intermediate frequency $F_{if}$ divided by the sampling frequency $F_s$, where the intermediate frequency $F_{if}$ is defined as follows: If the sampling frequency $F_s$ is less than twice the carrier frequency $F_c$, then $F_{if}=F_s-F_c$; otherwise, $F_{if}=F_c$.

Two numbers are said to be relatively prime when their greatest common divisor is 1. When the sampling frequency $F_s$ is related to the carrier frequency $F_c$ by a ratio of relatively prime numbers and the number representing the sampling frequency $F_s$ is less than about 30, the sampling frequency $F_s$ and the carrier frequency $F_c$ are said to be related by a ratio of small numbers. In that case, interference patterns can develop between the sampling frequency and the carrier frequency, and the ability of a BPSK/QPSK receiver to accurately resolve the phase of the signal can be severely inhibited. These communication problems can occur when the carrier frequency is unknown or when the receiver must work with signals in a wide range of carrier frequencies or both. Such problems can also occur in applications other than FTTC telecommunication systems based on BPSK/QPSK modulation, for example, mobile radio, modem, and other applications in which hard limiting is used prior to time/data extraction.

SUMMARY OF THE INVENTION

The present invention is directed to a scheme for limiting the interference patterns that can result when, for example, the sampling frequency of a BPSK/QPSK receiver is related to the BPSK/QPSK carrier frequency by a ratio of small numbers. According to one embodiment of the present invention, the BPSK/QPSK receivers used in the remote nodes of an FTTC system are designed to generate two different sampling frequencies that are selected such that, for all expected BPSK/QPSK carrier frequencies, using one of the two available sampling frequencies will reduce and possibly avoid the interference patterns that can result when the sampling frequency is related to the BPSK/QPSK carrier frequency by a ratio of small numbers. One way to ensure this advantageous result is to select the two different sampling frequencies such that they are not related by a ratio of small numbers (i.e., the relative magnitudes of the two sampling frequencies cannot be represented by a ratio of integers in which both integers are less than 30). For example, if one sampling frequency is 1 MHz, the other could be 31/32 MHz. In that case, any carrier in an expected range of carrier frequencies (e.g., from 10 to 250 KHz) will not be harmonically related to both sampling frequencies by a ratio of small numbers.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 1:
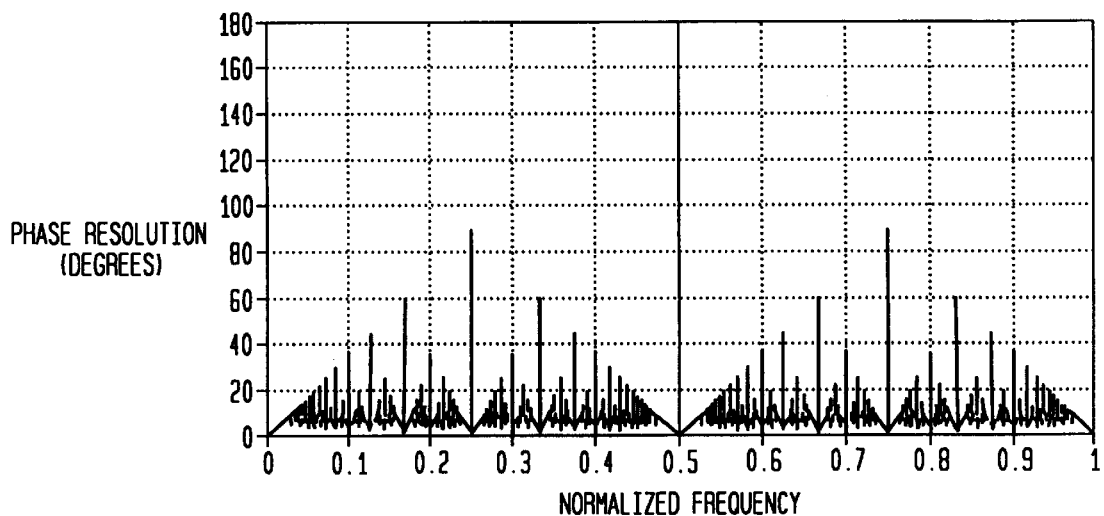
FIG. 1 shows the phase resolution of a BPSK/QPSK receiver as the carrier frequency changes relative to the sampling frequency.
Figure 2:
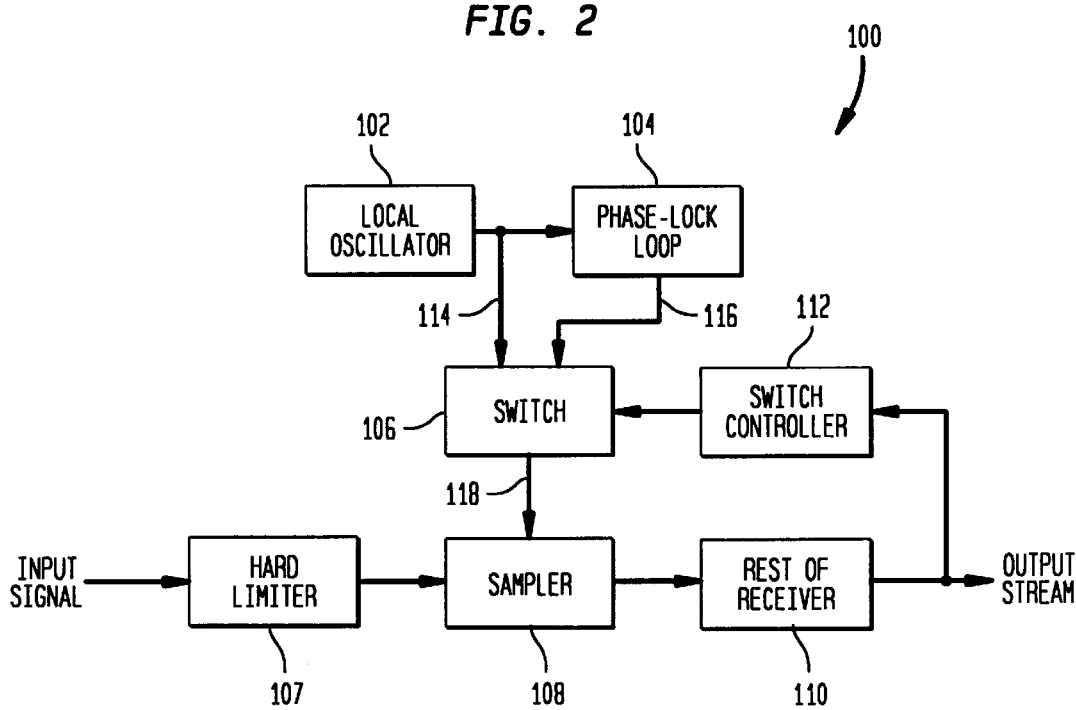
FIG. 2 shows a block diagram of a BPSK/QPSK receiver, according to one embodiment of the present invention.

FIG. 2 shows a block diagram of a BPSK/QPSK receiver 100, according to one embodiment of the present invention.

BPSK/QPSK receiver 100 generates (at least) two clock signals having two different frequencies. An appropriate one of these clocks is used to sample the hard-limited input signal to accurately derive the phase information encoded in the input signal. The selected clock can be changed for different input signals having different carrier frequencies as needed to avoid the sampling frequency being harmonically related to the carrier frequency (i.e., when their frequencies are related by a ratio of small numbers).

In particular, local oscillator 102 (e.g., crystal-based) generates a first clock 114 having a first frequency. Phase-lock loop (PLL) 104 converts the first clock 114 into a second clock 116 having a second frequency different from the first frequency. Both clocks are input to switch 106, which is controlled by switch controller 112 to select one of the two clocks as an input to sampler 108, which samples the input signal at the frequency of the selected clock 118 after the input signal has been hard limited by hard limiter 107. Block 110, representing the rest of receiver 100, derives the phase information from the sampled stream generated by sampler 108 to generate the output stream.

In a feedback loop, switch controller 112 analyzes the output stream to determine whether the selected clock has a frequency that is appropriate for sampling the current input signal. Depending on the particular implementation, this determination can be made in different ways. For example, switch controller 112 can analyze the signature of the output stream to determine the harmonic resolution which is apparent from the spread of the constellation. In another possible implementation, receiver 100 can receive a control message or other information from an external source dictating which clock signal is to be selected by switch controller 112.

In any case, if switch controller 112 determines that the currently selected clock has an inappropriate frequency for sampling the current input signals, then switch controller 112 causes switch 106 to select the other clock for use in driving sampler 108. In this way, receiver 100 ensures that the input signal is sampled at an appropriate frequency that avoids undesirable interference patterns between the sampling frequency and the carrier frequency of the input signal.

In one possible implementation of the present invention, the frequency of the second clock ($F_2$) is related to the frequency of the first clock ($F_1$) by Equation (1) as follows $$F_2 = \frac{K-1}{K} F_1 \quad (1)$$

where K is the number of samples per symbol in the data stream. Thus, when $F_1$ is 1 MHz and when the symbol rate is 1/32 Mbaud (i.e., 32 samples per symbol), $F_2$ is 31/32 MHz. In this case, the carrier frequency $F_c$ will not be harmonically related by small numbers to both sampling frequencies. A frequency to which it is not harmonically related is used to sample the input signal and derive the carrier phase. In this example, the ratio 31/32 has been chosen such that there is an integral number of samples per symbol in both cases, thus simplifying downstream processing. In general, since K and K−1 are relatively prime (i.e., their greatest common divisor is 1), no expected carrier frequency will be harmonically related to both sampling frequencies by small numbers.

Equation (1) represents one possible implementation of the present invention. Other implementations can be based on other equations, such as Equation (2) as follows:

$$F_2 = \frac{K+1}{K} F_1 \quad (2)$$

If it is desirable to use only one set of timing recovery and carrier recovery algorithms, the samples at 31/32 MHz can be reinterpolated in the digital domain to 1 MHz, using multiple bit resolution to avoid loss of phase information.

The present invention provides a flexible receiver whose phase resolution and hence its performance does not dramatically fall at certain carrier frequencies, as happens with a single sampling frequency.

In receiver 100 of FIG. 2, phase-lock loop 104 is used to generate the second clock. Any jitter in PLL 104 will result in jitter in the output of sampler 108. High-frequency (i.e., fast) jitter will be filtered out in the receiver, while any low-frequency (i.e., slow) jitter can be compensated for by implementing carrier phase tracking within block 110.

If the carrier frequency of the input signal is known, then a BPSK/QPSK receiver according to the present invention can be programmed to select the desired sampling frequency of the two available frequencies.

Although receiver 100 of FIG. 2 generates only two different clock signals, in alternative embodiments of the present invention, the receiver may be able to operate at three or more different sampling frequencies. Similarly, although receiver 100 of FIG. 2 has a local oscillator for generating the first clock and a phase-lock loop for generating the second clock, in alternative embodiments of the present invention, the clocks may be generated by other suitable components. In addition, one or more of the clocks may be generated external to the receiver.

Although the present invention has been described in the context of a BPSK/QPSK receiver, the present invention can be implemented in receivers designed to process signals generated using other phase-based modulation schemes, such as bi-phase shift keying and other shift-keying schemes of higher order than BPSK/QPSK. Furthermore, in addition to FTTC systems, the present invention is useful in mobile radio, modem, and other applications where hard-limiting is used prior to timing/data extraction.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A receiver for processing an input signal having a carrier frequency, the input signal having phase information, the receiver comprising:

(a) a first clock generator adapted to generate a first clock independent of the carrier frequency of the input signal, wherein the first clock has a first clock frequency;

(b) a second clock generator adapted to generate a second clock independent of the carrier frequency of the input signal, wherein the second clock has a second clock frequency different from the first clock frequency;

(c) a sampler adapted to sample the input signal exclusively using a selected sampling clock having a selected sampling frequency; and (d) a switch adapted to select one of the first and second clocks as the selected sampling clock for the input signal, wherein the selection of the selected sampling clock is dependent upon the carrier frequency of the input signal, wherein the clock frequency of the selected sampling clock is not harmonically related to the carrier frequency of the input signal.

2. The invention of claim 1, wherein the receiver further comprises a controller adapted to select the selected sampling frequency from the first and second clock frequencies.

3. The invention of claim 1, wherein the input signal was generated using a BPSK/QPSK modulation scheme.

4. The invention of claim 1, wherein the second clock frequency $F_2$ is related to the first clock frequency $F_1$ by the following equation:

$$F_2 = \frac{K \pm 1}{K} F_1$$

where K is the number of samples per symbol in the input signal.

5. The invention of claim 1, wherein:
the first clock generator is a local oscillator adapted to generate the first clock; and
the second clock generator is a phase-lock loop adapted to generate the second clock from the first clock.

6. The invention of claim 1, wherein low-frequency phase jittering is compensated for by carrier phase tracking.

7. The invention of claim 1, wherein the receiver is part of a remote node in a fiber-to-the-curb communication system.

8. The invention of claim 1, wherein:
the receiver further comprises:
  (e) a hard limiter adapted to hard limit the input signal prior to being sampled by the sampler;
  (f) a controller adapted to select the selected sampling clock from the first and second clocks;
the input signal was generated using a BPSK/QPSK modulation scheme;
the second clock frequency $F_2$ is related to the first clock frequency $F_1$ by the following equation:

$$F_2 = \frac{K \pm 1}{K} F_1$$

where K is the number of samples per symbol in the input signal;
the first clock generator is a local oscillator adapted to generate the first clock;
the second clock generator is a phase-lock loop adapted to generate the second clock from the first clock; and
low-frequency phase jittering is compensated for by carrier phase tracking; and
the receiver is part of a remote node in a fiber-to-the-curb communication system.

9. The invention of claim 1, further comprising a hard limiter adapted to hard limit the input signal prior to being sampled by the sampler.

10. The invention of claim 1, wherein the relative magnitudes of the first and second clock frequencies cannot be represented by a ratio of integers in which both integers are less than 30.

11. The invention of claim 7, wherein step (d) further comprises the step of hard limiting the input signal before sampling.

12. The invention of claim 7, wherein the relative magnitudes of the first and second clock frequencies cannot be represented by a ratio of integers in which both integers are less than 30.

13. A method for processing an input signal having a carrier frequency, the input signal having phase information, comprising the steps of:

(a) generating a first clock independent of the carrier frequency of the input signal, wherein the first clock has a first clock frequency;

(b) generating a second clock independent of the carrier frequency of the input signal, wherein the second clock has a second clock frequency different from the first clock frequency;

(c) selecting one of the first and second clocks as a selected sampling clock, wherein the selection is dependent upon the carrier frequency of the input signal, wherein the clock frequency of the select sampling clock is not harmonically related to the carrier frequency of the input signal;

(d) sampling the input signal exclusively using the selected sampling clock.

14. The invention of claim 13, wherein the input signal was generated using a BPSK/QPSK modulation scheme.

15. The invention of claim 13, wherein the second clock frequency $F_2$ is related to the first clock frequency $F_1$ by the following equation:

$$F_2 = \frac{K \pm 1}{K} F_1$$

where K is the number of samples per symbol in the input signal.

16. The invention of claim 13, wherein low-frequency phase jittering is compensated for by carrier phase tracking.

17. The invention of claim 13, wherein:
the input signal was generated using a BPSK/QPSK modulation scheme;
the second clock frequency $F_2$ is related to the first clock frequency $F_1$ by the following equation:

$$F_2 = \frac{K \pm 1}{K} F_1$$

where K is the number of samples per symbol in the input signal; and
low-frequency phase jittering is compensated for by carrier phase tracking.

* * * * *